US012610459B2

(12) United States Patent (10) Patent No.: US 12,610,459 B2
Takimoto et al. (45) Date of Patent: Apr. 21, 2026

(54) METHOD FOR PRODUCING WIRING CIRCUIT BOARD AND WIRING CIRCUIT BOARD

(71) Applicant: NITTO DENKO CORPORATION, Osaka (JP)

(72) Inventors: Kenya Takimoto, Osaka (JP); Naoki Shibata, Osaka (JP); Hayato Takakura, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 16 days.

(21) Appl. No.: 18/007,388

(22) PCT Filed: May 24, 2021

(86) PCT No.: PCT/JP2021/019629
§ 371 (c)(1),
(2) Date: Jan. 30, 2023

(87) PCT Pub. No.: WO2022/030074
PCT Pub. Date: Feb. 10, 2022

(65) Prior Publication Data
US 2024/0260177 A1 Aug. 1, 2024

(30) Foreign Application Priority Data
Aug. 7, 2020 (JP) ................................. 2020-134812

(51) Int. Cl.
*H05K 1/02* (2006.01)
*H05K 3/02* (2006.01)

(52) U.S. Cl.
CPC ............. *H05K 1/0298* (2013.01); *H05K 3/02* (2013.01)

(58) Field of Classification Search
None
See application file for complete search history.

(56) References Cited

U.S. PATENT DOCUMENTS

2012/0031648 A1* 2/2012 Ebe ........................... H05K 1/09
174/250
2016/0057867 A1 2/2016 Yamauchi et al.
(Continued)

FOREIGN PATENT DOCUMENTS

JP 2000-309887 A 11/2000
JP 2007-088056 A 4/2007
(Continued)

OTHER PUBLICATIONS

International Preliminary Report on Patentability issued by WIPO on Feb. 7, 2023, in connection with International Patent Application No. PCT/JP2021/019629.
(Continued)

*Primary Examiner* — Laura C Powers
(74) *Attorney, Agent, or Firm* — Edwards Neils LLC; Jean C. Edwards, Esq.

(57) ABSTRACT

Provided is a method for producing a wiring circuit board that includes the steps of forming a first metal layer on a metal supporting substrate; forming an insulating layer on the first metal layer; removing a portion of the first metal layer, the portion being exposed at the opening portion of the insulating layer, to expose the metal supporting substrate at the opening portion; forming a second metal layer on a portion of the metal supporting substrate exposed at the opening portion and on the insulating layer; and forming a conductive layer on the second metal layer. A wiring circuit board includes the metal supporting substrate, the first metal layer having a first opening portion, the insulating layer having a second opening portion having an opening along the first opening portion, the second metal layer connected to the metal supporting substrate, and the conductive layer on the second metal layer.

2 Claims, 3 Drawing Sheets

(56)                    References Cited

U.S. PATENT DOCUMENTS

| | | | |
|---|---|---|---|
| 2020/0170110 | A1 | 5/2020 | Kang et al. |
| 2021/0212196 | A1 | 7/2021 | Ito et al. |
| 2024/0015884 | A1* | 1/2024 | Shibata .................. H05K 1/092 |

FOREIGN PATENT DOCUMENTS

| | | | |
|---|---|---|---|
| JP | 2012-222047 | A | 11/2012 |
| JP | 2016-045971 | A | 4/2016 |
| JP | 2019-212659 | A | 12/2019 |
| TW | 201038163 | A | 10/2010 |
| WO | 2012/137669 | A1 | 10/2012 |

OTHER PUBLICATIONS

International Search Report issued in PCT/JP2021/019629 on Aug. 10, 2021.
Written Opinion issued in PCT/JP2021/019629 on Aug. 10, 2021.
Office Action, issued by the Korean Intellectual Property Office on Apr. 28, 2025, in connection with Korean Patent Application No. 10-2023-7002278.
Office Action, issued by the Taiwanese Patent Office on Feb. 14, 2025, in connection with Taiwanese Patent Application No. 110120572.
Office Action, issued by the Korean Intellectual Property Office on Dec. 10, 2025, in connection with Korean Patent Application No. 10-2023-7002278.

\* cited by examiner

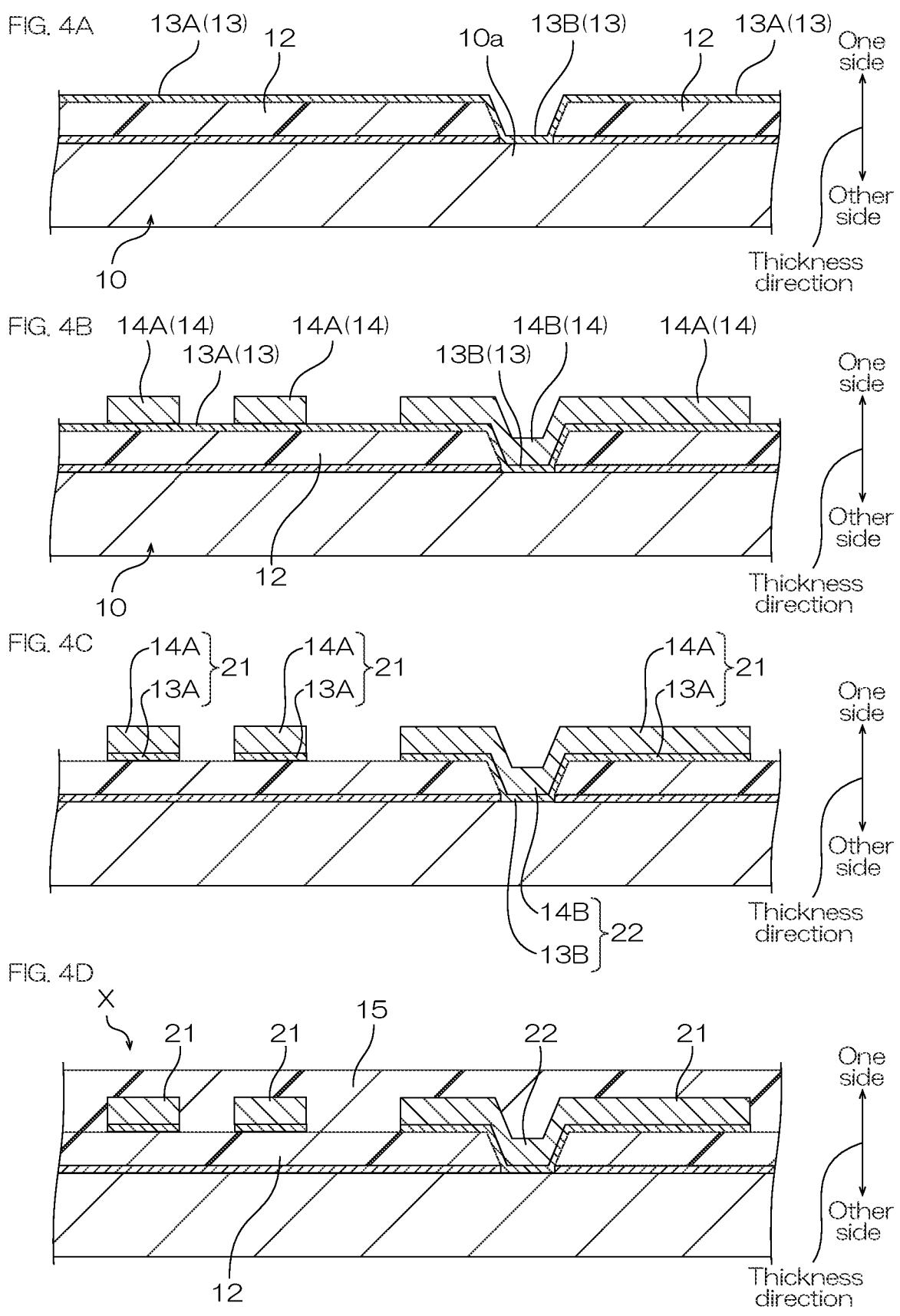

METHOD FOR PRODUCING WIRING CIRCUIT BOARD AND WIRING CIRCUIT BOARD

CROSS-REFERENCE TO RELATED APPLICATIONS

The present application is a 35 U.S.C. 371 National Stage Entry of PCT/JP2021/019629, filed on May 24, 2021, which claims priority from Japanese Patent Application No. 2020-134812, filed on Aug. 7, 2020, the contents of all of which are herein incorporated by reference in their entirety.

TECHNICAL FIELD

The present invention relates to a method for producing a wiring circuit board and a wiring circuit board.

BACKGROUND ART

A wiring circuit board including a metal supporting substrate as a supporting substrate, an insulating layer on the metal supporting substrate, and a wiring pattern on the insulating layer is known. In the wiring circuit board, for example, a metal layer for ensuring adhesion of the insulating layer with respect to the metal supporting substrate is provided between the metal supporting substrate and the insulating layer. The art relating to such a wiring circuit board is, for example, described in Patent Document 1 below.

CITATION LIST

Patent Document

Patent Document 1: Japanese Unexamined Patent Publication No. 2019-212659

SUMMARY OF THE INVENTION

Problem to be Solved by the Invention

In the above-described wiring circuit board including the metal supporting substrate, a via which penetrates the insulating layer in a thickness direction to be connected to the metal supporting substrate and the wiring pattern may be provided. The metal supporting substrate and the wiring pattern are electrically connected through the via. The wiring circuit board has been, conventionally, for example, produced as described next.

First, a metal layer (first metal layer) is formed on the metal supporting substrate. Next, an insulating layer having a via hole (opening portion) is formed on the first metal layer. The insulating layer forming step includes a heating process. Next, a seed layer is formed on the insulating layer. The seed layer is also formed in the via hole. In the via hole, the seed layer is formed so as to cover the first metal layer and an inner wall surface of the via hole which are exposed. The seed layer is a metal layer (second metal layer). Next, a conductive layer is formed on the seed layer. The conductive layer includes a first conductive portion having a predetermined pattern on the insulating layer, and a second conductive portion inside the via hole. Next, a portion of the seed layer which is not covered with the conductive layer is removed. Thus, the wiring pattern consisting of the seed layer and the first conductive portion thereon is formed on the insulating layer, and the via consisting of the seed layer and the second conductive portion thereon is formed on the first metal layer inside the via hole.

In such a conventional production method, in the insulating layer forming step (including the heating process), the first metal layer surface exposed at the via hole is oxidized. Therefore, in the via hole, the via is formed on the first metal layer having an oxide film on its surface. Therefore, in the wiring circuit board to be produced, the via is electrically connected to the metal supporting substrate through the first metal layer with the oxide film. Such a configuration is not preferable from the viewpoint of reducing resistance of an electrical connection between the metal supporting substrate and the wiring layer.

The present invention provides a method for producing a wiring circuit board suitable for realizing an electrical connection of low resistance between a metal supporting substrate and a wiring layer formed on an insulating layer on the substrate. The present invention provides a wiring circuit board suitable for realizing the electrical connection of the low resistance between the metal supporting substrate and the wiring layer formed on the insulating layer on the substrate.

Means for Solving the Problem

The present invention [1] includes a method for producing a wiring circuit board including a first metal layer forming step of forming a first metal layer on one surface in a thickness direction of a metal supporting substrate; an insulating layer forming step of forming an insulating layer on one surface in the thickness direction of the first metal layer, the insulating layer having an opening portion; a removing step of removing a portion of the first metal layer, the portion being exposed at the opening portion, to expose the metal supporting substrate at the opening portion; a second metal layer forming step of forming a second metal layer over on one surface in the thickness direction of the insulating layer and on a portion of the metal supporting substrate exposed at the opening portion; and a conductive layer forming step of forming a conductive layer on one surface in the thickness direction of the second metal layer.

In the method for producing a wiring circuit board of the present invention, after the above-described insulating layer forming step, the above-described removing step is carried out. Therefore, according to the present production method, even when the surface of the first metal layer facing the opening portion is oxidized in the insulating layer forming step; the oxide can be appropriately removed, and the metal supporting substrate can be exposed at the opening portion in the removing step. In the opening portion, in the subsequent second metal layer forming step, the second metal layer is formed on the surface of the metal supporting substrate facing the opening portion, and in the subsequent conductive layer forming step, the conductive layer is formed on the second metal layer. Thus, the via is formed in the opening portion (in the conductive layer forming step, the conductive layer is also formed on the second metal layer on the insulating layer, and thus, a wiring layer is formed on the insulating layer).

Thus, according to the present production method, the via inside the opening portion of the insulating layer can be formed so as to be directly connected to the metal supporting substrate (via is not electrically connected to the metal supporting substrate through the first metal layer having the oxide film). Therefore, the present production method is suitable for realizing an electrical connection of low resistance between the metal supporting substrate and the wiring layer formed on the insulating layer on the substrate.

The present invention [2] includes a wiring circuit board including a metal supporting substrate; a first metal layer disposed on one surface in a thickness direction of the metal supporting substrate and having a first opening portion; an insulating layer disposed on one surface in the thickness direction of the first metal layer and having a second opening portion having an opening along the first opening portion; a second metal layer disposed on one surface in the thickness direction of the insulating layer and on a portion of the metal supporting substrate facing the first and second opening portions, the second metal layer being connected to the metal supporting substrate; and a conductive layer disposed on one surface in the thickness direction of the second metal layer.

In the wiring circuit board having such a configuration, the via inside the opening portion (first opening portion, second opening portion) is directly connected to the metal supporting substrate facing the opening portion (via is not electrically connected to the metal supporting substrate through the first metal layer having the oxide film). Therefore, the present wiring circuit board is suitable for realizing the electrical connection of the low resistance between the metal supporting substrate and the wiring layer formed on the insulating layer on the substrate.

BRIEF DESCRIPTION OF THE DRAWINGS

FIG. 3A illustrating a preparing step,

FIG. 3B illustrating a first metal layer forming step,

FIG. 3C illustrating a base insulating layer forming step, and

FIG. 3D illustrating a removing step.

FIGS. 4A to 4D show steps subsequent to the steps shown in FIG. 3D:

FIG. 4A illustrating a second metal layer forming step,

FIG. 4B illustrating a conductive layer forming step,

FIG. 4C illustrating an etching step, and

FIG. 4D illustrating a cover insulating layer forming step.

DESCRIPTION OF EMBODIMENTS

Figure 1:
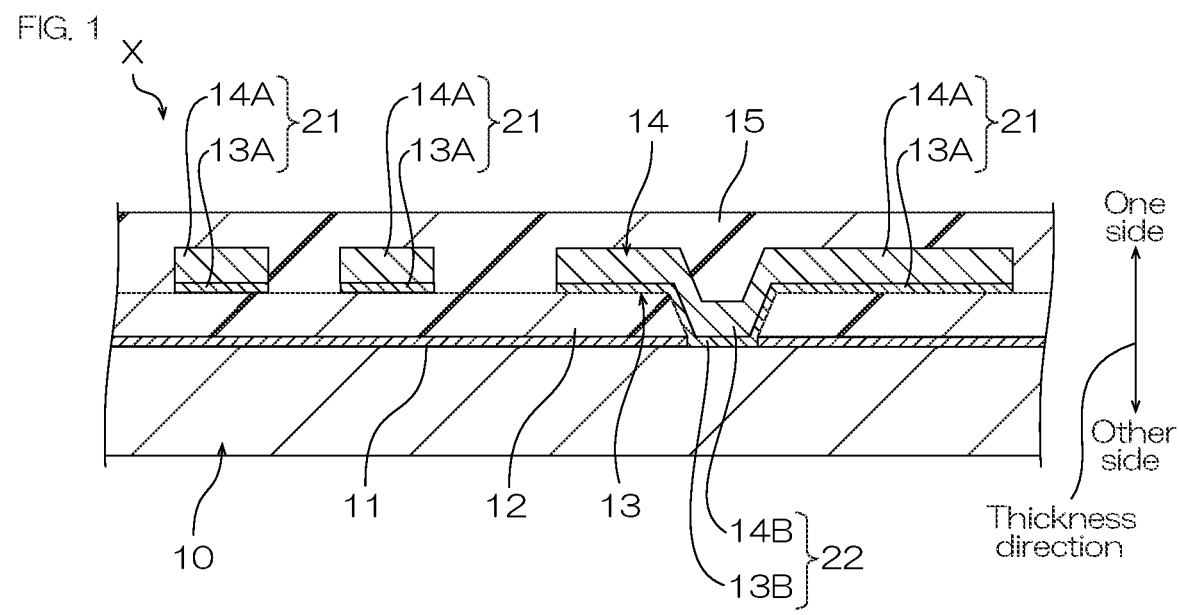
FIG. 1 shows a partially cross-sectional view of one embodiment of a wiring circuit board of the present invention.
Figure 2:
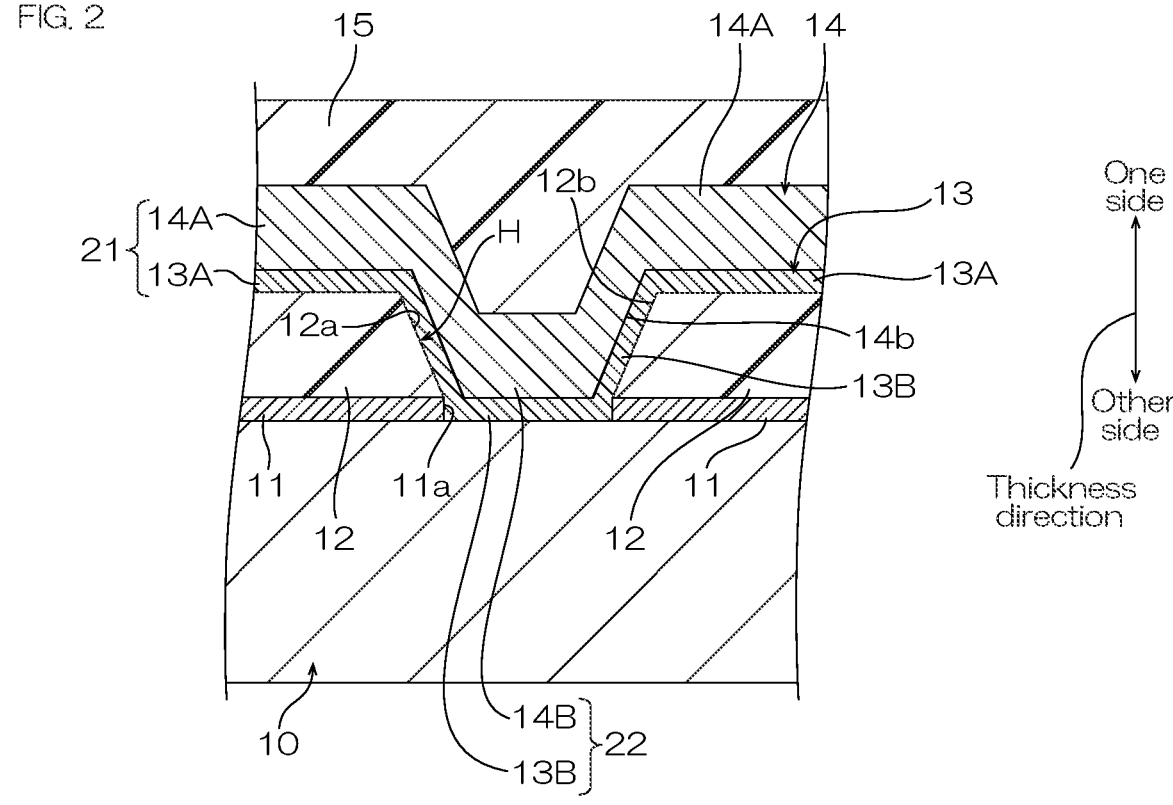
FIG. 2 shows a partially enlarged cross-sectional view of the wiring circuit board shown in FIG. 1.

As shown in FIGS. 1 and 2, a wiring circuit board X includes a metal supporting substrate 10, a first metal layer 11, an insulating layer 12 as a base insulating layer, a second metal layer 13, a conductive layer 14, and an insulating layer 15 as a cover insulating layer.

The metal supporting substrate 10 is an element for ensuring the mechanical strength of the wiring circuit board X.

When the wiring circuit board X is configured as a flexible wiring circuit board, the metal supporting substrate 10 is a metal flexible substrate. Examples of a material for the flexible substrate include copper, copper alloy, stainless steel, and 42-alloy. An example of the stainless steel includes SUS304 based on standards of AISI (American Iron and Steel Institute). A thickness of the metal supporting substrate 10 as a flexible substrate is, for example, 15 μm or more. The thickness of the metal supporting substrate 10 as a flexible substrate is, for example, 500 μm or less, preferably 250 μm or less.

When the wiring circuit board X is configured as a rigid wiring circuit board, the metal supporting substrate 10 is a metal rigid substrate. Examples of the rigid substrate include metal flat plates. The thickness of the metal supporting substrate 10 as a rigid substrate is, for example, 0.1 mm or more. The thickness of the metal supporting substrate 10 as a rigid substrate is, for example, 2 mm or less, preferably 1.6 mm or less.

The first metal layer 11 is disposed on one surface in a thickness direction of the metal supporting substrate 10. In the present embodiment, the first metal layer 11 is disposed over the entire one-side surface in the thickness direction of the metal supporting substrate 10.

The first metal layer 11 is a layer for ensuring adhesion of the insulating layer 12 with respect to the metal supporting substrate 10. Examples of the first metal layer 11 include films formed by a sputtering method (sputtering film) and films formed by a plating method (plating film).

Examples of the material for the first metal layer 11 include chromium, nickel, and titanium. The material for the first metal layer 11 may be an alloy containing two or more metals selected from the group consisting of chromium, nickel, and titanium. As the material for the first metal layer 11, preferably, chromium is used.

The thickness of the first metal layer 11 is, for example, 1 nm or more, preferably 10 nm or more, more preferably 20 nm or more. The thickness of the first metal layer 11 is, for example, 10000 nm or less, preferably 1000 nm or less, more preferably 500 nm or less.

The first metal layer 11 has an opening portion 11a (first opening portion) penetrating the first metal layer 11 in the thickness direction. The opening portion 11a has, for example, a generally circular opening shape when viewed from the top.

The insulating layer 12 is disposed on one surface in the thickness direction of the first metal layer 11. Examples of the material for the insulating layer 12 include resin materials such as polyimide, polyether nitrile, polyether sulfone, polyethylene terephthalate, polyethylene naphthalate, and polyvinyl chloride (examples of the material for the insulating layer 15 to be described later include the same resin materials). The thickness of the insulating layer 12 is, for example, 1 μm or more, preferably 3 μm or more. The thickness of the insulating layer 12 is, for example, 35 μm or less.

The insulating layer 12 has an opening portion 12a (second opening portion) penetrating the insulating layer 12 in the thickness direction. The opening portion 12a has, for example, a generally circular opening shape when viewed from the top, and communicates with the opening portion 11a of the first metal layer 11. The opening portion 12a is overlapped with the opening portion 11a when viewed from the top. Specifically, the opening portion 12a has an opening along the opening portion 11a of the first metal layer 11. The opening portion 12a and the opening portion 11a form an opening portion H. Further, in the present embodiment, the opening portion 12a has an inclined inner wall surface 12b. The inner wall surface 12b is inclined so that a portion thereof closer to the metal supporting substrate 10 is positioned further inwardly.

The second metal layer 13 is disposed continuously over on one surface in the thickness direction of the insulating layer 12 and on a portion 10a of the metal supporting substrate 10 facing the opening portion H. Specifically, the second metal layer 13 includes a second metal layer 13A (the first of second metal layer) disposed outside the opening portion H, and a second metal layer 13B (the second of second metal layer) disposed inside the opening portion H. The second metal layer 13A has a predetermined pattern shape on the insulating layer 12. In the opening portion H, the second metal layer 13B is directly connected to the metal supporting substrate 10. The second metal layer 13A and the second metal layer 13B are connected.

The second metal layer 13 is a seed layer for forming the conductive layer 14. Examples of the second metal layer 13 include sputtering films and plating films.

Examples of the material for the second metal layer 13 include chromium, copper, nickel, and titanium. The material for the second metal layer 13 may be an alloy containing two or more metals selected from the group consisting of chromium, copper, nickel, and titanium. As the material for the second metal layer 13, preferably, chromium is used.

The thickness of the second metal layer 13 is, for example, 1 nm or more, preferably 10 nm or more. The thickness of the second metal layer 13 is, for example, 500 nm or less, preferably 200 nm or less.

The conductive layer 14 is disposed on one surface in the thickness direction of the second metal layer 13. The conductive layer 14 includes a first conductive portion 14A disposed outside the opening portion H, and a second conductive portion 14B disposed inside the opening portion H. The first conductive portion 14A and the second conductive portion 14B are connected. The first conductive portion 14A has a predetermined pattern shape. The second conductive portion 14B has an inclined peripheral side surface 14b. The peripheral side surface 14b is inclined so that a portion thereof closer to the metal supporting substrate 10 is positioned further inwardly.

Examples of the material for the conductive layer 14 include copper, nickel, and gold. The material for the conductive layer 14 may be an alloy containing two or more metals selected from the group consisting of copper, nickel, and gold. As the material for the conductive layer 14, preferably, copper is used.

On the insulating layer 12, the second metal layer 13A and the first conductive portion 14A on the second metal layer 13A form a wiring layer 21 having a predetermined pattern shape. In the opening portion H, the second metal layer 13B and the second conductive portion 14B on the second metal layer 13B form a via 22. The metal supporting substrate 10 and the wiring layer 21 are electrically connected through the via 22. For example, the wiring layer 21 is ground-connected through the via 22 with respect to the metal supporting substrate 10.

The thickness of the wiring layer 21 is, for example, 3 μm or more, preferably 5 μm or more. The thickness of the wiring layer 21 is, for example, 50 μm or less, preferably 30 μm or less. A width of the wiring layer 21 (dimension in a direction perpendicular to an extending direction of the wiring layer 21) is, for example, 5 μm or more, preferably 8 μm or more. The width of the wiring layer 21 is, for example, 100 μm or less, preferably 50 μm or less.

The insulating layer 15 is disposed on one side in the thickness direction of the insulating layer 12 so as to cover the wiring layer 21 and the via 22. The insulating layer 15 may also have an opening portion which partially exposes the wiring layer 21 and/or the via 22. That is, the insulating layer 15 may have an opening portion, and the wiring layer 21 and/or the via 22 may be exposed at the opening portion. The portion exposed at the opening portion in the wiring layer 21 and/or the via 22 constitutes, for example, a terminal portion of the wiring circuit board X. The thickness of the insulating layer 15 is, for example, 4 μm or more, preferably 6 μm or more. The thickness of the insulating layer 15 is, for example, 60 μm or less, preferably 40 μm or less.

In the wiring circuit board X, the via 22 in the opening portion H is directly connected to the metal supporting substrate 10 facing the opening portion H (the via 22 is not electrically connected to the metal supporting substrate 10 through the first metal layer 11 with an oxide film on the via 22-side surface). Therefore, the wiring circuit board X is suitable for realizing an electrical connection of low resistance between the metal supporting substrate 10 and the wiring layer 21.

FIGS. 3A to 3D and 4A to 4D show a method for producing the wiring circuit board X as one embodiment of a method for producing a wiring circuit board of the present invention. FIGS. 3A to 3D and 4A to 4D show the present production method as a change in a cross section corresponding to FIG. 1.

Figure 3A:
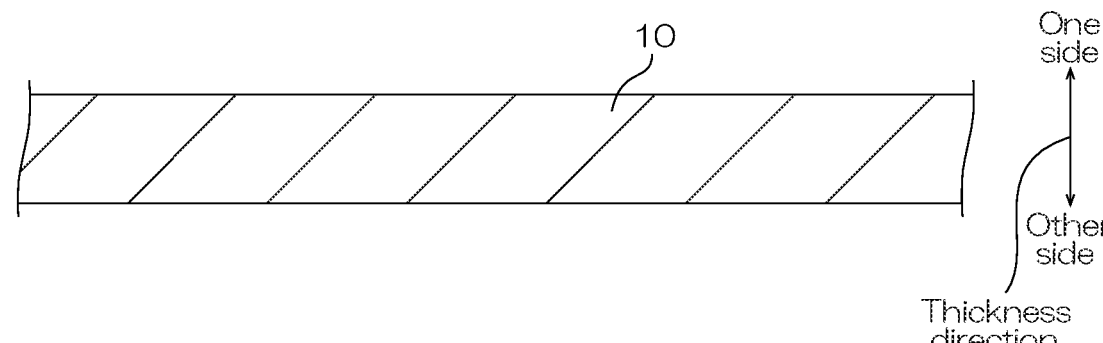
FIGS. 3A to 3D show a part of steps of a method for producing the wiring circuit board shown in FIG. 1.

In the present production method, first, as shown in FIG. 3A, the metal supporting substrate 10 is prepared (preparing step).

Figure 3B:
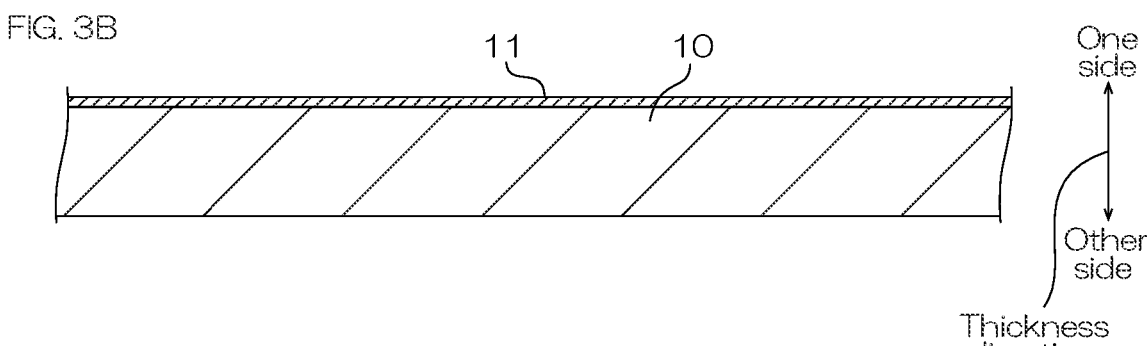

Next, as shown in FIG. 3B, the first metal layer 11 is formed on the metal supporting substrate 10 (first metal layer forming step). Examples of the method for forming the first metal layer 11 include the sputtering method, a vacuum deposition method, and the plating method. Examples of the plating method include an electrolytic plating method and an electroless plating method. The first metal layer 11 is preferably formed by the sputtering method. The material for the first metal layer 11 is as described above. In the present embodiment, the first metal layer 11 is formed over the entire one-side surface in the thickness direction of the metal supporting substrate 10.

Figure 3C:
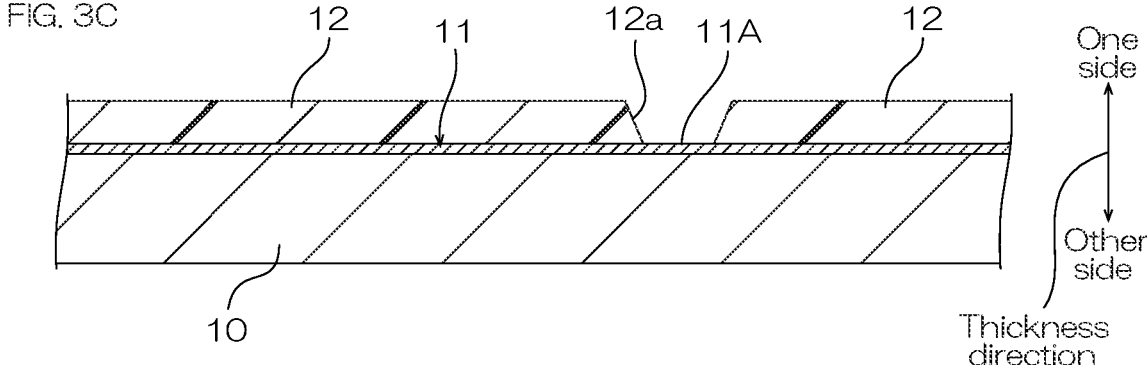

Next, as shown in FIG. 3C, the insulating layer 12 is formed on one surface in the thickness direction of the first metal layer 11 (base insulating layer forming step). In this step, for example, the insulating layer 12 is formed as follow. First, a solution (varnish) of a photosensitive resin is coated on the first metal layer 11, thereby forming a coating film. Next, the coating film is dried by heating. Next, the coating film is subjected to an exposure process through a predetermined mask, a subsequent development process, and thereafter, if necessary, a bake process. For example, as described above, the insulating layer 12 having the opening portion 12a can be formed on the first metal layer 11. In the opening portion 12a, a portion 11A of the first metal layer 11 is exposed. The exposed surface (upper surface in the drawing) of the portion 11A is oxidized through a heating process included in this step.

Figure 3D:
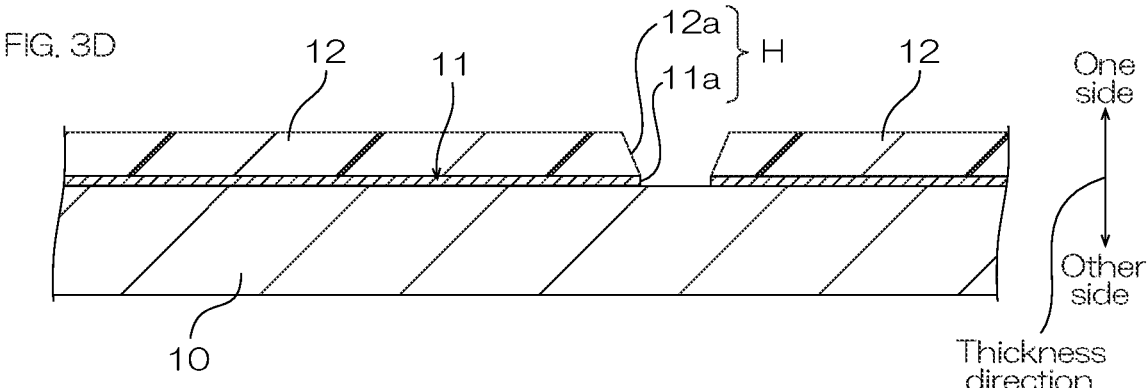

Next, by removing the portion 11A of the first metal layer 11 which is exposed at the opening portion 12a, as shown in FIG. 3D, a portion (the portion 10a) of the metal supporting substrate 10 is exposed at the opening portion 12a (removing step). In this step, the opening portion 11a is formed in the first metal layer 11 by removing the portion 11A. The opening portion 11a has an opening along the opening portion 12a, and the opening portion H is formed by these opening portions 11a and 12a.

Examples of a removing method in this step include wet etching and dry etching, and preferably, wet etching is used. Examples of an etchant used in the wet etching include a ceric ammonium nitrate solution, an aqueous solution of caustic soda, a potassium permanganate solution, and a sodium metasilicate solution, and preferably, a ceric ammonium nitrate solution is used. A temperature of the etchant in the wet etching is, for example, 20° C. or more, preferably 30° C. or more. The temperature of the etchant is, for example, 80° C. or less, preferably 65° C. or less. The etching time (immersion time) in the wet etching is, for example, 1 minute or more. The etching time is, for example, 15 minutes or less, preferably 10 minutes or less.

In the present production method, next, as shown in FIG. 4A, the second metal layer 13 is formed (second metal layer forming step). In this step, the second metal layer 13 is formed continuously over on one surface in the thickness direction of the insulating layer 12 and on the portion 10a of the metal supporting substrate 10 exposed at the opening portion H (the second metal layer 13 includes the second metal layer 13A outside the opening portion H, and the second metal layer 13B inside the opening portion H). Examples of the method for forming the second metal layer 13 include the sputtering method, the vacuum deposition method, and the plating method. Examples of the plating method include the electrolytic plating method and the electroless plating method. The second metal layer 13 is preferably formed by the sputtering method.

Next, as shown in FIG. 4B, the conductive layer 14 is formed on one surface in the thickness direction of the second metal layer 13 (conductive layer forming step). Specifically, the forming method is performed, for example, as follow.

First, a resist pattern is formed on the second metal layer 13. The resist pattern has an opening portion having a shape corresponding to a pattern shape of the conductive layer 14. In the formation of the resist pattern, first, a photosensitive resist film is attached onto the second metal layer 13, thereby forming a resist film. Next, the resist film is subjected to the exposure process through the predetermined mask, the subsequent development process, and thereafter, if necessary, the bake process. In the formation of the conductive layer 14, next, for example, a metal material is grown on the second metal layer 13 inside the opening portion of the resist pattern by the electrolytic plating method. As the metal material, preferably, copper is used. Next, the resist pattern is removed. For example, as described above, the conductive layer 14 of a predetermined pattern can be formed on one surface in the thickness direction of the second metal layer 13 (the conductive layer 14 includes the first conductive portion 14A on the second metal layer 13A, and the second conductive portion 14B on the second metal layer 13B).

In the present production method, next, as shown in FIG. 4C, in the second metal layer 13, the portion which is not covered with the conductive layer 14 is removed by etching (etching step). Thus, the wiring layer 21 (the second metal layer 13A, the first conductive portion 14A) and the via 22 (the second metal layer 13B, the second conductive portion 14B) are formed.

Next, as shown in FIG. 4D, the insulating layer 15 is formed on the insulating layer 12 so as to cover the wiring layer 21 and the via 22 (cover insulating layer forming step). In this step, for example, the insulating layer 12 is formed as follow. First, the solution (varnish) of the photosensitive resin is coated on the insulating layer 12, and on the wiring layer 21 and the via 22, thereby forming the coating film. Next, the coating film is dried. Next, the coating film is subjected to the exposure process through the predetermined mask, the subsequent development process, and thereafter, if necessary, the bake process. For example, as described above, the insulating layer 12 as a cover insulating layer can be formed.

As described above, the wiring circuit board X can be produced.

In the present production method, the removing step (shown in FIG. 3D) is carried out after the base insulating layer forming step (shown in FIG. 3C). In the base insulating layer forming step, the surface of the portion 11A of the first metal layer 11 facing the opening portion 12a is oxidized. However, in the removing step, the portion 11A is removed, and the metal supporting substrate 10 is exposed at the opening portion H (including the opening portion 12a). In the subsequent second metal layer forming step (shown in FIG. 4A), the second metal layer 13B is formed on the portion 10a of the metal supporting substrate 10 facing the opening portion H. Then, in the conductive layer forming step (shown in FIG. 4B), the second conductive portion 14B is formed on the second metal layer 13B. Thus, the via 22 is formed inside the opening portion H.

Thus, according to the present production method, the via 22 can be formed so as to be directly connected to the metal supporting substrate 10 (the via 22 is not electrically connected to the metal supporting substrate 10 through the first metal layer 11 with the oxide film on its via-side surface). Therefore, the present production method is suitable for realizing the electrical connection of the low resistance between the metal supporting substrate 10 and the wiring layer 22.

The present production method preferably includes a plasma process step after the removing step (shown in FIG. 3D) and before the second metal layer forming step (shown in FIG. 4A). The surface of the metal supporting substrate 10 which is exposed at the opening portion H can be cleaned by the plasma process step. The configuration in which the present production method includes such a plasma process step serves to realize the electrical connection of the low resistance between the metal supporting substrate 10 and the wiring layer 21.

INDUSTRIAL APPLICATION

The wiring circuit board of the present invention can be used for a wiring circuit board including a metal supporting substrate as a supporting substrate.

DESCRIPTION OF REFERENCE NUMERALS

X Wiring circuit board
10 Metal supporting substrate
11 First metal layer
11a, 12a, H Opening portion
12 Insulating layer
12b Inner wall surface
13, 13A, 13B Second metal layer
14 Conductive layer
14A First conductive portion
14B Second conductive portion
14b Peripheral side surface
15 Insulating layer
21 Wiring layer
22 Via

The invention claimed is:

1. A method for producing a wiring circuit board comprising:

a first metal layer forming step of forming a first metal layer on one surface in a thickness direction of a metal supporting substrate;

an insulating layer forming step of forming an insulating layer directly on one surface in the thickness direction of the first metal layer, the insulating layer having a second opening portion;

a removing step of removing a portion of the first metal layer, the portion being exposed at the second opening portion, to form a first opening portion in order to expose the metal supporting substrate at the first opening portion and the second opening portion;

a second metal layer forming step of forming a second metal layer over on one surface in the thickness direction of the insulating layer and on a portion of the metal supporting substrate exposed at the first opening portion and the second opening portion; and a conductive layer forming step of forming a conductive layer on one surface in the thickness direction of the second metal layer;

wherein the second metal layer is a seed layer over which the conductive layer is formed, and wherein in the first opening portion and the second opening portion, the second metal layer is disposed between the conductive layer and the metal supporting substrate, and in contact with the conductive layer and the metal supporting substrate.

2. A wiring circuit board comprising:

a metal supporting substrate;

a first metal layer disposed on one surface in a thickness direction of the metal supporting substrate, and having a first opening portion;

an insulating layer disposed directly on one surface in the thickness direction of the first metal layer, and having a second opening portion having an opening along the first opening portion;

a second metal layer disposed on one surface in the thickness direction of the insulating layer and on a portion of the metal supporting substrate facing the first and second opening portions, the second metal layer being connected to the metal supporting substrate; and a conductive layer disposed on one surface in the thickness direction of the second metal layer;

wherein the second metal layer is a seed layer over which the conductive layer is formed, and wherein in the first opening portion and the second opening portion, the second metal layer is disposed between the conductive layer and the metal supporting substrate, and in contact with the conductive layer and the metal supporting substrate.

* * * * *